United States Patent
Mittal et al.

(10) Patent No.: US 8,751,244 B2
(45) Date of Patent: *Jun. 10, 2014

(54) APPARATUS AND METHOD FOR LOW COMPLEXITY COMBINATORIAL CODING AND DECODING OF SIGNALS

(75) Inventors: Udar Mittal, Bangalore (IN); James P. Ashley, Naperville, IL (US)

(73) Assignee: Motorola Mobility LLC, Chicago, IL (US)

( * ) Notice: Subject to any disclaimer, the term of this patent is extended or adjusted under 35 U.S.C. 154(b) by 405 days.

This patent is subject to a terminal disclaimer.

(21) Appl. No.: 13/098,501

(22) Filed: May 2, 2011

(65) Prior Publication Data

US 2012/0284032 A1    Nov. 8, 2012

(51) Int. Cl.
*G10L 19/00*    (2013.01)

(52) U.S. Cl.
USPC ............... 704/500; 341/51; 341/55; 341/107

(58) Field of Classification Search
USPC ............................... 704/201; 341/51; 708/495
See application file for complete search history.

(56) References Cited

U.S. PATENT DOCUMENTS

| | | | |
|---|---|---|---|
| 6,236,960 B1 | 5/2001 | Peng et al. | |
| 7,461,106 B2 | 12/2008 | Mittal et al. | |
| 7,889,103 B2 | 2/2011 | Mittal et al. | |
| 2008/0065374 A1 | 3/2008 | Mittal et al. | |
| 2009/0100121 A1* | 4/2009 | Mittal et al. | 708/495 |
| 2009/0231169 A1* | 9/2009 | Mittal et al. | 341/51 |
| 2009/0234642 A1* | 9/2009 | Mittal et al. | 704/201 |

OTHER PUBLICATIONS

Mittal U et al: "Low Complexity Factorial Pulse Coding of MDCT Coefficients using Approximation of Combinatorial Functions",2007 IEEE International Conference on Acoustics, Speech, and Signal Processing Apr. 15-20, 2007 Honolulu, HI, USA, IEEE, Piscataway, NJ, USA, Apr. 15, 2007, pp. I-289.

Patent Cooperation Treaty, International Search Report and Written Opinion of the International Searching Authority for International Application No. PCT/US2012/034360, Jun. 28, 2012, 11 pages.

Mittal, Udar et al.: "Low Complexity Factorial Pulse Coding of MDCT Coefficients Using Approximation of Combinatorial Functions", ICASSP 2007, 1-4244-0728-1/07/IEEE, pp. I-289 to I-292.

\* cited by examiner

*Primary Examiner* — Douglas Godbold
*Assistant Examiner* — Mark Villena

(57) ABSTRACT

A method and apparatus for low complexity combinatorial coding and decoding of signals is described herein. During operation, an encoder and a decoder will utilize a first function in determining a codeword or vector when the size of the function is small. The encoder and the decoder will also utilize a second function in determining the codeword or vector when the size of the function is large.

13 Claims, 3 Drawing Sheets

APPARATUS AND METHOD FOR LOW COMPLEXITY COMBINATORIAL CODING AND DECODING OF SIGNALS

FIELD OF THE INVENTION

The present invention relates generally to a method and apparatus for low complexity combinatorial coding and decoding of signals, and in particular to low-complexity combinational coding and decoding of vectors within electronic audio encoders and decoders.

BACKGROUND OF THE INVENTION

In order to transmit or store digitized audio, the audio must be encoded to a digital form. In doing so, the analog audio is digitized to form a vector or matrix. The digitized audio is then encoded in order to reduce the amount of information required to digitally represent the audio. Methods for encoding (coding) vector or matrix quantities for speech, audio, image, video, and other signals are well known. One such method described in U.S. Pat. No. 6,236,960 by Peng, et.al, (which is incorporated by reference herein) is known as Factorial Pulse Coding (or FPC). If elements of vector x are constrained such that $-m \leq x_i \leq m$, and values of $x_i$, are integral, then FPC can produce a codeword for a vector x using a total of M bits, given that:

$$m = \sum_{i=0}^{n-1} |x_i|, \qquad (1)$$

where m is the total number of unit amplitude pulses, and n is the vector length. For the N possibilities for vector x, the total M bits are used to code N combinations of vector x in a maximally efficient manner, such that the following expression, which describes the theoretical minimum number of combinations, holds true:

$$N = \sum_{d=1}^{min(m,n)} F(n,d)D(m,d)2^d \leq 2^M. \qquad (2)$$

For this equation, F(n,d) is a combinatorial function, having the number of combinations of d non-zero vector elements over n positions given by:

$$F(n,d) = \frac{n!}{d!(n-d)!}. \qquad (3)$$

D(m,d) are the number of combinations of d non-zero vector elements given m total unit pulses given by:

$$D(m,d)=F(m-1, d-1) \qquad (4)$$

and $2^d$ represents the combinations required to describe the polarity (sign) of the d non-zero vector elements. In the above equations n comprises a position parameter, d comprises a pulse index parameter. A method and apparatus for coding and decoding vectors described above have been fully described in the prior art. Furthermore, a practical implementation of this coding method has been described in 3GPP2 standard C.S0014-B, where the vector length n=54 and the number of unit magnitude pulses m=7 produce an M=35 bit codeword.

While these low values of n and m do not cause any unreasonable complexity burden, larger values can quickly cause problems, especially in mobile handheld devices which need to keep memory and computational complexity as low as possible. For example, use of this coding method for some applications (such as audio coding) may require n=144 and m=28, or higher. Under these circumstances, the cost associated with producing the combinatorial expression F(n,d) can be quite high.

Let us rewrite Eq. 3 as:

$$F(n,d) = \frac{\prod_{i=n-d+1}^{n} (i)}{\prod_{j=1}^{d} (j)}. \qquad (5)$$

F(144, 28) would require 197 bits of precision in the numerator and 98 bits of precision in the denominator to produce a 99 bit quotient. Since most digital signal processors (DSPs) used in today's handheld devices typically support only 16 bit×16 bit multiply operations, special multi-precision multiply/divide routines would need to be employed. Such routines require a series of nested multiply/accumulate operations that typically require on the order of k multiple/accumulate (MAC) operations, where k is the number of 16 bit segments in the operand. For a 197 bit operand, k=⌈197/161⌉=13. So, execution of a single 197×16 bit multiply would require a minimum of 13 MAC operations plus shifting and store operations. The denominator term is calculated in a similar manner to produce a 98 bit result. In addition, a 197/98 bit division is required, which is an extremely complex operation. Thus computation of the entire factorial relation in Eq. 5 would require considerable resources. While prior art methods have addressed these complexity issues to some degree, large values of n and d still may require significant processing resources. Therefore a need exists for a method and apparatus for simplifying the technique utilized for F(n,d).

BRIEF DESCRIPTION OF THE DRAWINGS

FIG. 4 is a flow chart showing operation of the decoder of FIG. 4.

Figure 1:
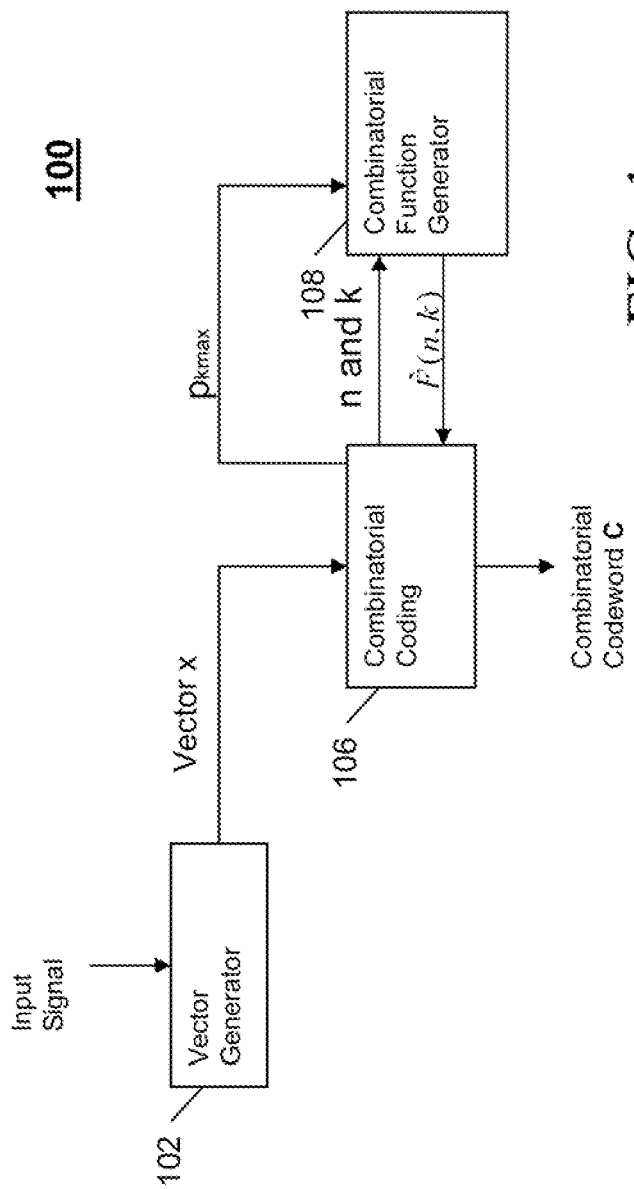
FIG. 1 is a block diagram of an encoder.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. Those skilled in the art will further recognize that references to specific implementation embodiments such as "circuitry" may equally be accomplished via either on general purpose computing apparatus (e.g., CPU) or specialized processing apparatus (e.g., DSP) executing software instructions stored in non-transitory computer-readable memory. Additionally, the elements within the figures exist within a tangible apparatus or electronic device. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION OF THE DRAWINGS

Because F(n,m) is utilized to produce a codeword for vector x, it may be possible to pre-compute and store all factorial combinations F(n,m) in a lookup table. Thus, all values of F(n,m) may be simply stored in an n×m matrix and appropriately retrieved from memory using very few processor cycles. The problem with this approach, however, is that as n and m become large, so does the associated memory requirement. Citing the previous example, F(144, 28) would require 144× 28×⌈99 bits/8 bits/byte⌉=52,416 bytes of storage, which is unreasonable for most mobile handheld devices.

In yet another implementation, F(n,d) is computed recursively as:

$$F(n,d)=F(n-1,d-1)+F(n-1,d), \quad (6)$$

which requires many multi-precision additions. To reduce the complexity, various different methods of using an approximation F'(n,d) of F(n,d) are described in described in the prior arts (U.S. Pat. No. 7,461,106 and US20090234642 A1). In prior art methods, the encoder and decoder use relatively low resolution approximations of factorial combinations F'(n,d), which provide only enough precision to allow a valid codeword to be generated. In U.S. Pat. No. 7,461,106, the combinatorial function is replaced by an approximate function F'(n, d) which is given as:

$$F'(n, d) = R'\left(\sum_{i=n-d+1}^{n} P'(i) - Q'(d)\right), \quad (7)$$

where $P(i) \approx \log_2(i)$, $Q(d) \approx \sum_{j=1}^{d} \log_2(j)$, and $R(k) \approx 2^k$ and where $k=k_i+k_f$ is broken down into integer and fractional components of k, and $K_f=2^{k_f}$ is obtained using a low resolution Taylor series expansion of the fractional component of k. Based on the above pre-defined functions Q'(d) and R'(k), P'(i) are first obtained and stored in memory so that the unique decodability inequality P'(i) are first obtained and stored in memory so that the unique decodability $$F'(n, d) \geq F'(n-1, d)+F'(n-1, d-1) \quad (8)$$

is satisfied for all values of n and d. To further reduce the complexity of the approximate combinatorial function in (7), instead of pre-storing P'(i), a partial summation of P'(i) such as:

$$S'(n) = \sum_{i=1}^{n} P'(i), \quad (9)$$

may be used. Now equation (7) can be equivalently computed as:

$$F'(n,d)=R'(S'(n)-S'(n-d)-Q'(d)) \quad (10)$$

where in the above equation R' comprises an estimate of a power function, S' comprises a log domain estimate of n!, and Q' comprises a log domain estimate of d!.

These combinatorial functions (both standard in equation (3) and approximated in equation (12)) can be used for coding of a pulse sequence given in equation (1). Let $\pi=\{p_1, p_2, \ldots, p_v\}$ be the positions of the non-zero pulses and v be the number of non-zero pulse positions (positions within vector x) in increasing order, and $\mu=\{m_1, m_2, \ldots, m_v\}$ be the magnitudes at respective positions within a vector x. For example if $p_3=45$ then the $3^{rd}$ non-zero pulse position within the codeword would at position 45 in vector x.

The code for pulse positions within the codeword is given by:

$$C_\pi = \sum_{k=1}^{v} F'(p_k, k) \; 0 \leq p_k < n, \quad (11)$$

and the code for pulse magnitudes within the codeword is given by:

$$C_\mu = \sum_{k=1}^{v-1} F'\left(\sum_{j=1}^{k} m_j - 1, k\right) 1 \leq \sum_{j=1}^{k} m_j, m_k < m. \quad (12)$$

Thus, the formulation of these codeword requires the addition of v and v-1 multi-precision numbers. Similar subtraction operations are needed in the decoder.

To further reduce the complexity of these addition and subtraction operations, in a prior art method described in US 20090100121A1, a pseudo floating point representation consisting of a mantissa and an exponent, is used for the representation of the approximate combinatorial function. A partial multi-precision codeword is generated by modifying a very small portion of a previously generated multi-precision codeword. The small portion of the codeword which is modified is identified from the exponent of the pseudo floating point representation of the approximate combinatorial function. That is, the exponent part identifies a shift factor that is applied to the mantissa part, which is subsequently added to or subtracted from the partial multi-precision codeword. Since much of the resolution of the standard combinatorial expression is lost, we refer to this as an "approximation" of the combinatorial function.

Let us look back at equation (11). (In the subsequence we will focus on equation (11) only as it can be shown that with suitable modification (11) and (12) are equivalent). Note that values for $p_k$ are increasing as k varies from 1 to v. The dynamic range of values of F'(n, k) is very large, i.e., for small values of k, the F'(n, k) result may be small (less than 32 bit precision) and for large values of k it may be very large, e.g., the equivalent of hundreds, or perhaps thousands of bits of precision. In cases where the dynamic range is very large, the approximate combinatorial function F'($p_k$, k) allows very efficient representation comprising very few bits. Consider now the example given in Table 1. In this example, the total number of positions to be coded is v=15, $p_k$ is a value of a $k_{th}$ non-zero vector position, and the respective positions to be coded $p_k$ are shown. As shown, for k≤6, the result of F'($p_k$, k)

can be represented with less than 32 bits of precision and for k>6, more than 32 bits is required. For k=15, F'($p_k$, k) has a result 74 bits long. Thus using a uniform approach for generation and representation of F'($p_k$, k) may not provide lowest overall complexity.

TABLE 1

Example of function F'($p_k$, k), for v = 15

| k | $p_k$ | F'($p_k$, k) | Significant bits $\lceil \log_2(F'(p_k, k)) \rceil$ |
|---|---|---|---|
| 1 | 5 | 5.00000E+00 | 3 |
| 2 | 15 | 1.05000E+02 | 7 |
| 3 | 35 | 6.54500E+03 | 13 |
| 4 | 40 | 9.13900E+04 | 17 |
| 5 | 50 | 2.11876E+06 | 22 |
| 6 | 65 | 8.25989E+07 | 27 |
| 7 | 89 | 6.89027E+09 | 33 |
| 8 | 100 | 1.86088E+11 | 38 |
| 9 | 112 | 5.49456E+12 | 43 |
| 10 | 120 | 1.16068E+14 | 47 |
| 11 | 140 | 6.77961E+15 | 53 |
| 12 | 145 | 1.12968E+17 | 57 |
| 13 | 150 | 1.83031E+18 | 61 |
| 14 | 171 | 1.21363E+20 | 67 |
| 15 | 198 | 1.25122E+22 | 74 |

In order to address this issue, a method and apparatus for low complexity combinatorial coding and decoding of signals is described herein. During operation, an encoder and a decoder will utilize a first function in determining a codeword when a non-zero pulse position is small. The encoder and the decoder will also utilize a second function in determining the codeword when the non-zero pulse position is large.

As an example, a coder may utilize a factorial pulse coding approach with standard representation of the combinatorial functions F(n,k) (equation 3) when the number of bits needed for representing F(n,k) is small (e.g., less than 32), otherwise the coder may use an approximate combinatorial function (e.g., equation 10) when the bits needed for representing F(n,k) is large.

In one embodiment of the present invention the maximum value ($p_k^{max}$) of $p_k$ is stored for which F($p_k$,k) is less than a predetermined value. The predetermined value, for example, can be a number that can be represented by M=31 or 32 bits, depending on implementation hardware. Let $p_k^{max}$ be the maximum vector position for which the k-th coded position can be represented with M bits or fewer. Considering the example in Table 2, let's assume a vector length of n=200 and the total number of coded positions as v=15. Thus for the first four non-zero positions to be coded k≤4, the entire range of 1≤$p_k$≤200 can be represented with 31 bits or less, therefore $p_k^{max}$=200, and the standard function F($p_k$,k) may be used. For the remaining non zero pulse positions k>4, the standard combinatorial function may be used whenever it can be represented using 31 bits otherwise the approximate combinatorial function is used. From Table 2, it can be seen that the threshold may be predetermined to allow the a lower complexity function to be selected, either the standard combinatorial function F($p_k^{max}$,k) or the approximate combinatorial function F'($p_k^{max}$,k). For example, when coding the k=9 non-zero vector position, the standard function F($p_k^{max}$,k) may be used if the value of $p_k$≤49, and the approximate combinatorial function F'($p_k^{max}$,k) may be used for coding non-zero vector positions 49<$p_k$≤200. Mathematically speaking we are defining a new function given by:

$$\hat{F}(p_k, k) = \begin{cases} F(p_k, k), & p_k \leq p_k^{max} \\ F'(p_k, k), & \text{otherwise} \end{cases} \quad 1 \leq k \leq v \quad (13)$$

and using it for encoding and decoding. It can be easily shown that $\hat{F}(n,k)$ also satisfies the unique decodability inequality shown in equation (8).

TABLE 2

Example showing F($p_k^{max}$, k), for n = 200, v = 15

| k | $p_k^{max}$ | F($p_k^{max}$, k) | Significant bits $\lfloor \log_2(F(p_k^{max}, k)) \rfloor$ |
|---|---|---|---|
| 1 | 200 | 200 | 8 |
| 2 | 200 | 19900 | 15 |
| 3 | 200 | 1313400 | 21 |
| 4 | 200 | 64684950 | 26 |
| 5 | 193 | 2118000528 | 31 |
| 6 | 110 | 2141851635 | 31 |
| 7 | 75 | 1984829850 | 31 |
| 8 | 58 | 1916797311 | 31 |
| 9 | 49 | 2054455634 | 31 |
| 10 | 43 | 1917334783 | 31 |
| 11 | 38 | 1203322288 | 31 |
| 12 | 37 | 1852482996 | 31 |
| 13 | 35 | 1476337800 | 31 |
| 14 | 34 | 1391975640 | 31 |
| 15 | 34 | 1855967520 | 31 |

The above approach can be easily used at the encoder because the encoder knows the value of $p_k$ for each value of k. However, since the decoder (for a particular value of k) does not know which function was used during encoding, it may have to start decoding $p_k$ using F'($p_k$,k) and then switch to F($p_k$,k) when it is sure that the value $p_k$ is less than $p_k^{max}$. This may not only increase the decoding complexity but also complicate the decoder implementation.

In order to handle the decoder operation properly, it is preferable that the technique used for determining the combinatorial function being used in encoding and decoding the current position of the of the vector is dependent on the value of the previous decoded position of the codeword.

Codewords are typically decoded from highest position to lowest position. Therefore, the type of combinatorial function should be used for coding of the $k^{th}$ position $p_k$ may be based on the value $p_{k+1}$ of the k+$^{th}$ coded position. So if F($p_{k+1}$−1, k) can be represented in less than 32 bits, then all other possible values of $p_k$ can also be represented in less than 32 bits. In such scenario, it is preferred to use a standard combinatorial function, otherwise an approximate combinatorial function is preferred. A mathematical definition of the modified function is given below.

$$\hat{F}(p_k, k) = \begin{cases} F(p_k, k), & p_{k+1} - 1 \leq p_k^{max} \\ F'(p_k, k), & \text{otherwise} \end{cases} \quad 1 \leq k \leq v \quad (14)$$

It can be further observed that $p_k^{max}$ is increasing sequence in k, i.e., $$p_{k-1}^{max} \leq p_k^{max} \leq p_{k+1}^{max}$$

This suggests that if a standard combinatorial function can be used for coding of the $k^{th}$ location then the same function can be used for previous locations, i.e, from 1 to k−1$^{th}$ locations. Similarly, if the approximate combinatorial function is needed for coding of the $k^{th}$ location then the same function is needed for coding of all subsequent locations from k+1 to v. Thus $$p_k^{max} = \max (p_k) \text{ s.t. } F(p_k, k) \leq 2^{31}. \qquad (15)$$

However, depending on other factors such as complexity and other particular requirements, we can choose any value of $p_k^{max}$ which is different from that given by equation (15). For example, the maximum length of the result of $F(p_k,k)$ may be limited to 40-bits or 64-bits instead of 31 or 32 bits. Moreover, to save memory, the value of $p_k^{max}$ may be upper limited to a value of 64 or 128 irrespective of whether $F(p_k,k)$ produce results of less than 32 bits, and may also depend on the hardware on which the process is executed.

Additionally, it is appreciated that the prior art may use coding of "position" information to code "magnitude" information as well, per Equation (12), and that the above description may apply to codeword generation of codeword $C_\mu$ as well as $C_\pi$. It is also known that coding positions of non-zero (occupied) vector elements is similar to coding positions of zero valued (non-occupied) vector elements, and that the description above also applies to those cases as well. Furthermore, it may be possible that different approximation functions are advantageous in certain situations such that a third combinatorial function may be introduced. It is also appreciated by the skill artisan that the "standard" combinatorial function may not be exactly an "n choose k" function. For example, certain modifications have been introduced in the prior art which allow more efficient coding methods to be implemented while maintaining a "standard" framework.

Turning now to the drawings, wherein like numerals designate like components, FIG. 1 is a block diagram of encoder 100. Encoder 100 comprises vector generator 102, combinational coding circuitry (coder) 106, and combinatorial function generator 108. The circuitry in FIG. 1 may be implemented within any hardware device that performs coding. Such devices include, but are not limited to a cellular telephone, landline telephone, music player, cable TV set top box, etc.

During operation, an input signal to be coded is received by vector generator 102. As is known in the art, the input signal may comprise such signals as speech, audio, image, video, and other signals. Vector generator 102 receives the input signal and creates vector x. In a preferred embodiment of the present invention the input signal comprises an audio input signal such as speech or music, but in alternate embodiments of the present invention the input signal may comprise music, voice, video, or any combination thereof. Vector generator 102 may comprise any number of encoding paradigms including, but not limited to, Code-Excited Linear Prediction (CELP) speech coding as described by Peng, et.al, transform domain coding for audio, images and video including Discrete Fourier Transform (DFT), Discrete Cosine Transform (DCT), and Modified Discrete Cosine Transform (MDCT) based methods, wavelet based transform coding, direct time domain pulse code modulation (PCM), differential PCM, adaptive differential PCM (ADPCM), or any one of a family of sub-band coding techniques that are well known in the art. Virtually any signal vector of the form given above may be advantageously processed in accordance with the present invention.

Combinatorial coding circuitry 106 receives vector x and uses Factorial Pulse Coding to produce a codeword C. As discussed above Factorial Pulse Coding can code a vector x using a total of M bits, given that $m = \sum_{i=0}^{n-1} |x_i|$, and all values of vector x are integral valued such that $-m \leq x_i \leq m$, where m is the total number of unit amplitude pulses, and n is the vector length. Also, as discussed above, the codeword generated is based on the combinatorial function F(n,k). As discussed above, larger values of m and n (and hence F(n,k) can quickly cause problems, especially in mobile handheld devices which need to keep memory and computational complexity as low as possible.

In order to address this issue, combinatorial function generator 108 utilizes a low complexity technique for producing F(n,k) when the number of bits needed for representing F(n,k) is small (e.g., less than 32), otherwise the coder 106 uses an approximate combinatorial function (e.g., equation 10) when the bits needed for representing F(n,k) is large. More particularly, combinatorial coding circuitry 106 utilizes $$\hat{F}(p_k, k) = \begin{cases} F(p_k, k), & p_k \leq p_k^{max} \\ F'(p_k, k), & \text{otherwise} \end{cases} \quad 1 \leq k \leq v$$

or alternatively $$\hat{F}(p_k, k) = \begin{cases} F(p_k, k), & p_{k+1} - 1 \leq p_k^{max} \\ F'(p_k, k), & \text{otherwise} \end{cases} \quad 1 \leq k \leq v$$

to produce codeword C. Thus, when the bits needed for representing F(n,k) is large, circuitry 108 utilizes relatively low resolution approximations of factorial combinations F'(n,d), which provide only enough precision to allow a valid codeword to be generated. That is, as long as certain properties are maintained, a suitable approximation of the function F(n,d) is sufficient to guarantee that the resulting codeword is uniquely decodable.

Figure 2:
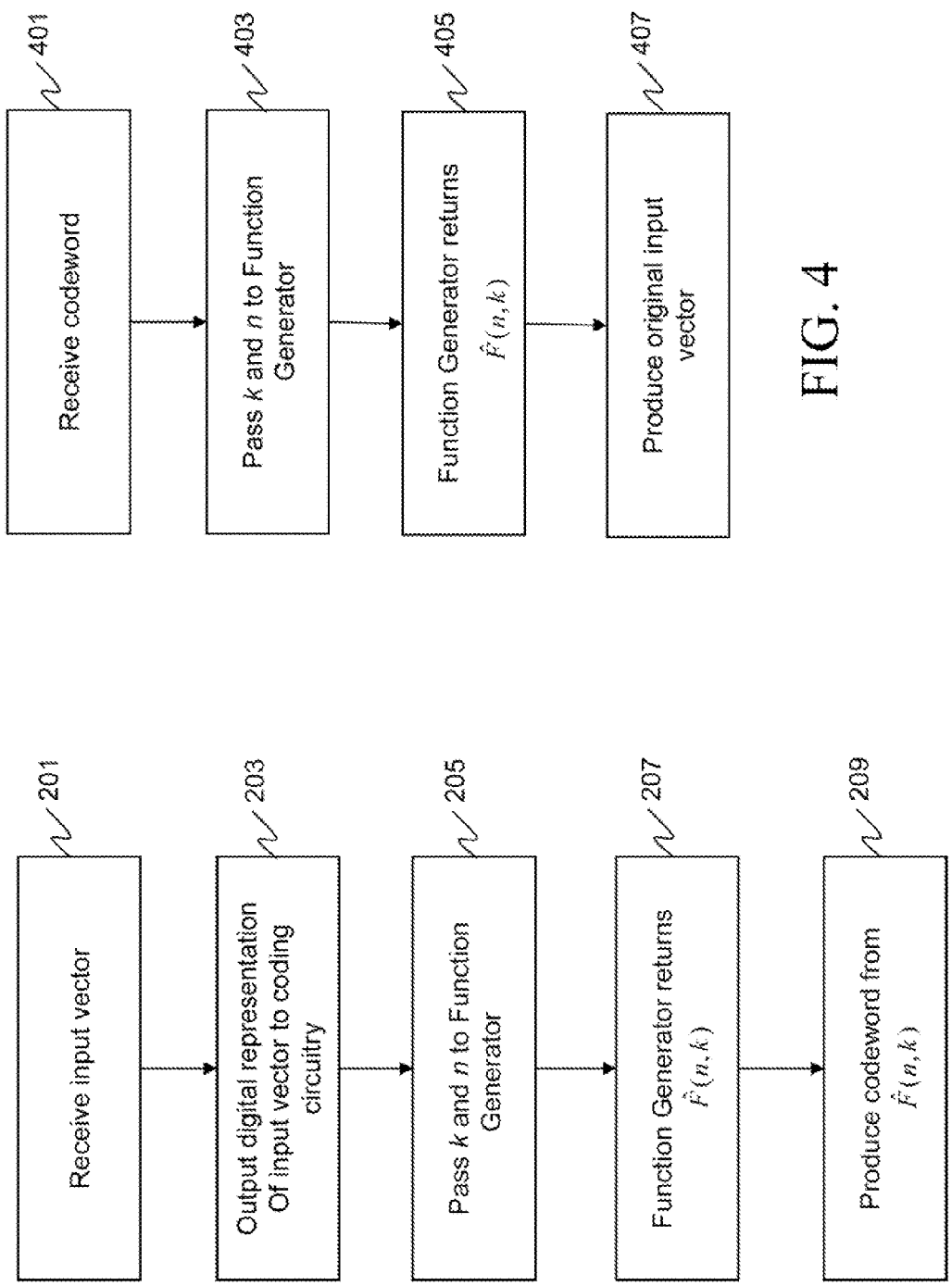
FIG. 2. is a flow chart showing operation of the encoder of FIG. 1.

FIG. 2 is a flow chart showing operations performed by electronic encoder 100. The logic flow begins at step 201 where an input signal is received by vector generator 102. At step 203 generator 202 outputs a digital representation of the input signal as vector x which is received by coding circuitry 106. As discussed above, coding circuitry 106 utilizes either F'(n,k) or F(n,k) to produce a codeword representing vector x. Stated differently, the electronic encoder will choose either a first function or a second function in the production of a codeword C from the vector x, wherein the electronic encoder chooses the first or the second function based on a non-zero vector position of the vector x being less than a predetermined value.

With the above in mind, a maximum value of $p_k$ exists (and is stored by circuitry 106) for which $F(p_k,k)$ is less than a predetermined value (e.g., 32 bits long). Let $p_k^{max}$ be the maximum such value. This value is either stored by generator 108 or can be passed to generator 108 by coding circuitry 106. Regardless of how generator 108 receives $p_k^{max}$ at step 205 index value k and n (the vector length of x) is passed to generator 108. At step 207, combinatorial function generator 108 returns $$\hat{F}(p_k, k) = \begin{cases} F(p_k, k), & p_k \leq p_k^{max} \\ F'(p_k, k), & \text{otherwise} \end{cases} \quad 1 \leq k \leq v$$

or alternatively $$\hat{F}(p_k, k) = \begin{cases} F(p_k, k), & p_{k+1} - 1 \le p_k^{max} \\ F'(p_k, k), & \text{otherwise} \end{cases} \quad 1 \le k \le v$$

Coding circuitry 106 then produces the appropriate codeword C for vector x based on the returned value of $F(p_k, k)$ (step 209). In particular the codeword is generated b circuitry 106 as:

$$C_\pi = \sum_{k=1}^{v} \hat{F}(p_k, k), \ 0 \le p_k < n$$

This codeword can then be transmitted or stored (in storage not shown) by encoder 100.

Figure 3:
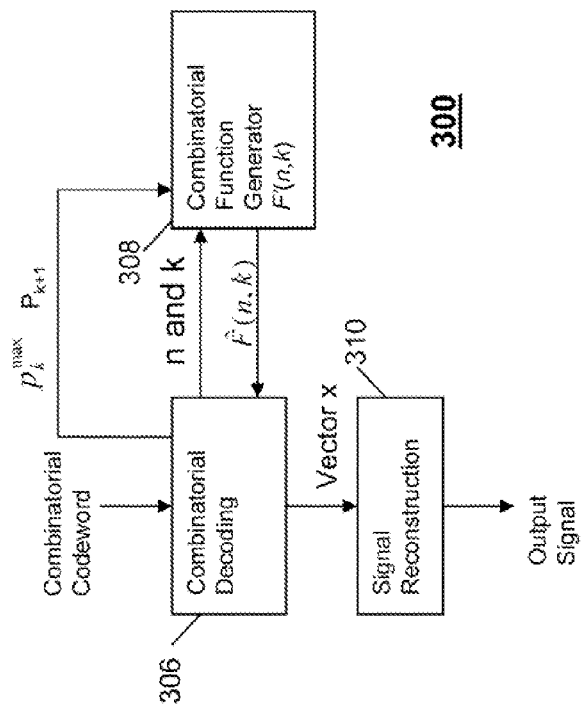
FIG. 3. is a block diagram of a decoder.

FIG. 3 is a block diagram of decoder 300. As shown, decoder 300 comprises combinatorial decoding circuitry 306, signal reconstruction circuitry 310, and combinatorial function generator 108. The circuitry in FIG. 3 may be implemented within any hardware device that performs decoding. Such devices include, but are not limited to a cellular telephone, landline telephone, music player, cable TV set top box, etc.

During operation a combinatorial codeword is received by combinatorial decoding circuitry 306. Combinatorial decoding circuitry 306 provides n and k to combinatorial function generator, and receives $\hat{F}(n,k)$ in response. Decoding circuitry 306 then creates vector x based on $\hat{F}(n,k)$. Circuitry 306 operates in a similar manner as circuitry 106 since $\hat{F}(n,k)$ must be the same for both encoding and decoding. Thus, decoding circuitry 306 will feed n, k, to function generator 308. The prior value of $p_{k+1}$ or $p_k^{max}$ be provided as well. In return, generator 308 will return $$\hat{F}(p_k, k) = \begin{cases} F(p_k, k), & p_k \le p_k^{max} \\ F'(p_k, k), & \text{otherwise} \end{cases} \quad 1 \le k \le v$$

or alternatively $$\hat{F}(p_k, k) = \begin{cases} F(p_k, k), & p_{k+1} - 1 \le p_k^{max} \\ F'(p_k, k), & \text{otherwise} \end{cases} \quad 1 \le k \le v$$

Decoder 306 will then decode the current position of the codeword based on the current value of $\hat{F}(n,k)$. This results in the digital representation of the original input signal of FIG. 1, which is output to signal reconstruction circuitry 310 where digital to analog conversion of the signal may take place to output the original input signal.

FIG. 4 is a flow chart showing operation of decoder 300. The logic flow begins at step 401 where a codeword is received by decoding circuitry 306. For each position within the codeword, n and k are provided to combinatorial function generator (step 403). As with the encoder, $p_k^{max}$ may be provided to function generator 108 at step 403 or may be known beforehand by function generator 108. In addition, in an alternate embodiment of the present invention $p_{k+1}$ may be provided to function generator 308 at step 403 or may be known beforehand by generator 308. In response at step 405, generator provides $$\hat{F}(p_k, k) = \begin{cases} F(p_k, k), & p_k \le p_k^{max} \\ F'(p_k, k), & \text{otherwise} \end{cases} \quad 1 \le k \le v$$

or alternatively $$\hat{F}(p_k, k) = \begin{cases} F(p_k, k), & p_{k+1} - 1 \le p_k^{max} \\ F'(p_k, k), & \text{otherwise} \end{cases} \quad 1 \le k \le v.$$

At step 407 combinatorial decoding circuitry 306 outputs vector x to signal reconstruction circuitry 310 where the original input signal is reconstructed and output. The original input signal may be output as voice over a simple speaker (not shown).

Figure 5:
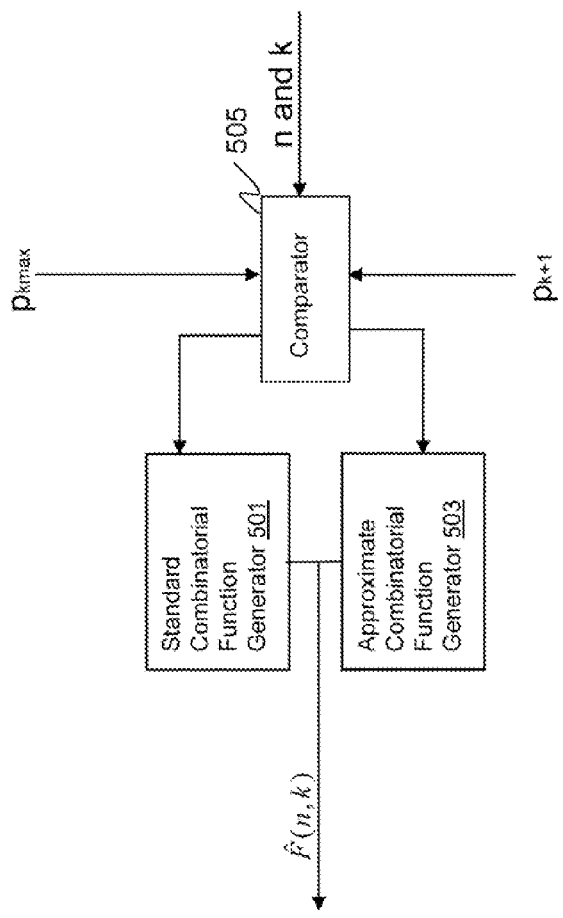
FIG. 5 is a detailed view of the Combinatorial Function Generator block in FIG. 1 and FIG. 3.

FIG. 5 is a block diagram showing a combinatorial function generator that can be used in both an encoder and decoder. As shown, generator 500 comprises both a standard combinatorial function generator 501 and an approximate combinatorial function generator 503. A comparator 505 is provided in order to determine if generator 501 or generator 503 will be used to output $\hat{F}(n,k)$. More particularly, comparator 505 will determine if $p_{k+1} < p_k^{max}$ or alternatively if $p_{k+1} - 1 <= p_k^{max}$. Based on this determination, either generator 501 or generator 503 will be utilized as described above. More particularly, generator 501 or generator 503 will be used, returning either a first function or a second function. The first function or a second function will be used in the production of a codeword C from the vector x. The first function or the second function will be chosen based on a non-zero vector position of the vector x being less than a predetermined value.

The step of choosing either the first function or the second function comprises the step of choosing $\hat{F}=\hat{F}(p_k,k)$ wherein $p_k$ is a value of a $k_{th}$ non-zero vector position. A factorial pulse coding approach with standard representation of $\hat{F}$ may be used when the number of bits needed for representing $\hat{F}$ is small, otherwise an approximation for $\hat{F}$ may be used when the bits needed for representing $\hat{F}$ is large. Stated more specifically, $$\hat{F} = F(n, d) = \frac{n!}{d!(n-d)!}$$

when the number of bits needed for representing $\hat{F}$ is small otherwise $\hat{F}=F'(n,d)=R'(S'(n)-S'(n-d)-Q'(d)$ when the bits needed for representing $\hat{F}$ is large, wherein n comprises a position parameter, d comprises a pulse index parameter, R' comprises an estimate of a power function, S' comprises a log domain estimate of n!, and Q' comprises a log domain estimate of d!.

While the invention has been particularly shown and described with reference to a particular embodiment, it will be understood by those skilled in the art that various changes in form and details may be made therein without departing from the spirit and scope of the invention. It is intended that such changes come within the scope of the following claims:

The invention claimed is:
1. A method for coding vectors within an electronic encoder, the method comprising the steps of:
 creating, by a processor, a vector x at the electronic encoder from an input signal;

generating a modified combinatorial function output based on a comparison between a set of non-zero vector position $p_k$ of the vector x and a set of predetermined value $p_k^{max}$, wherein the modified combinatorial function output comprises either a standard combinatorial function output or an approximate combinatorial function output; and generating a codeword C based on a set of the modified combinatorial function outputs, wherein the step of generating the modified combinatorial function output comprises:

$$\hat{F}(p_k, k) = \begin{cases} F(p_k, k), & p_k \le p_k^{max} \\ F'(p_k, k), & \text{otherwise} \end{cases} \quad 1 \le k \le v$$

or alternatively $$\hat{F}(p_k, k) = \begin{cases} F(p_k, k), & p_{k+1} - 1 \le p_k^{max} \\ F'(p_k, k), & \text{otherwise} \end{cases} \quad 1 \le k \le v$$

wherein v is the number of elements in the set, $F(p_k, k)$ is the standard combinatorial function output, and $F'(p_k, k)$ is the approximate combinatorial function output.

2. The method of claim 1 wherein the standard combinatorial function output is expressed by $$\hat{F} = F(n, d) = \frac{n!}{d!(n-d)!}$$

wherein n is a position parameter and d is a pulse index parameter.

3. The method of claim 1 wherein the approximate combinatorial function output comprises $\hat{F}=F'(n,d)=R'(S'(n)-S'(n-d)-Q'(d))$, wherein n is a position parameter, d is a pulse index parameter, R' is an estimate of a power function, S'(n) is a log domain estimate of n! and Q'(d) is a log domain estimate of d!.

4. The method of claim 1 wherein generating a codeword C based on a set of modified combinatorial function outputs further comprises summing the set of modified combinatorial function outputs as:

$$C_\pi = \sum_{k=1}^{v} \hat{F}(p_k, k), \, 0 \le p_k < n$$

wherein v is the number of elements in the set, n is a position parameter, and $p_k$ is a non-zero vector position.

5. An apparatus comprising:
a vector generator creating a vector x at an electronic encoder from an input signal;
coding circuitry using a modified combinatorial function output comprising either a standard combinatorial function output or an approximate combinatorial function output in the production of a codeword C from the vector x, wherein the standard combinatorial function output or the approximate combinatorial function output is used based on a comparison between a set of nonzero vector positions $p_k$ of the vector x and a set of predetermined values $p_k^{max}$, wherein the coding circuitry uses the modified combinatorial function output comprising one of:

$$\hat{F}(p_k, k) = \begin{cases} F(p_k, k), & p_k \le p_k^{max} \\ F'(p_k, k), & \text{otherwise} \end{cases} \quad 1 \le k \le v$$

or alternatively $$\hat{F}(p_k, k) = \begin{cases} F(p_k, k), & p_{k+1} - 1 \le p_k^{max} \\ F'(p_k, k), & \text{otherwise} \end{cases} \quad 1 \le k \le v$$

wherein v is the number of elements in the set, F (p_k, k) is the standard combinatorial function output, and F'(pk, k) is the approximate combinatorial function output.

6. The apparatus of claim 5 wherein the approximate combinatorial function output comprises $\hat{F}=F'(n,d)=R'(S'(n)-S'(n-d)-Q'(d))$, n is a position parameter, d is a pulse index parameter, R' is an estimate of a power function, S'(n) is a log domain estimate of n!, and Q'(d) is a log domain estimate of d!.

7. The apparatus of claim 5 wherein the standard combinatorial function output is expressed by $$\hat{F} = F(n, d) = \frac{n!}{d!(n-d)!}$$

wherein n is a position parameter and d is a pulse index parameter.

8. A method for decoding a vector x within an electronic decoder, the method comprising the steps of:
receiving, by a processor, a codeword C at the electronic decoder;
decoding a previous non-zero position $(p_{k+1})$ of the vector x based on the codeword;
selecting a modified combinatorial function output comprising either a standard combinatorial function output or an approximate combinatorial function output, based on the previous non-zero vector position $(p_{k+1})$ of the vector x being less than a predetermined value;
decoding a non-zero position (pk) based on the modified combinatorial function output, wherein the modified combinatorial function output comprises one of:

$$\hat{F}(p_k, k) = \begin{cases} F(p_k, k), & p_k \le p_k^{max} \\ F'(p_k, k), & \text{otherwise} \end{cases} \quad 1 \le k \le v$$

or alternatively $$\hat{F}(p_k, k) = \begin{cases} F(p_k, k), & p_{k+1} - 1 \le p_k^{max} \\ F'(p_k, k), & \text{otherwise} \end{cases} \quad 1 \le k \le v$$

wherein v is the number of elements in the set, $F(p_k,k)$ is the standard combinatorial function, and $F'(p_k,k)$ is the approximate combinatorial function.

9. The method of claim 8 wherein the approximate combinatorial function output comprises $\hat{F}=F'(n,d)=R'(S'(n)-S'(n-d)-Q'(d))$, wherein n is a position parameter, d is a pulse index parameter, R' is an estimate of a power function, S'(n) is a log domain estimate of n!, and Q'(d) is a log domain estimate of d!.

10. The method of claim 8 wherein the standard combinatorial function output is expressed by $$\hat{F} = F(n, d) = \frac{n!}{d!(n-d)!}$$

wherein n is a position parameter and d is a pulse index parameter.

11. An apparatus for decoding a vector x comprising:
decoding circuitry receiving a codeword C, using a modified combinatorial function output comprising either a standard combinatorial function output or an approximate combinatorial function output, based on the previous non-zero vector position of the vector x being less than a predetermined value, and either a first function or a second function in the production of a vector x from a codeword, wherein the first or the second function is used based on a non-zero vector position of the vector x being less than a predetermined value; and
decoding a non-zero position (pk) based on the modified combinatorial function: and
signal reconstruction circuitry creating an output signal from the vector x, wherein the decoding circuitry uses the modified combinatorial function output given by:

$$\hat{F}(p_k, k) = \begin{cases} F(p_k, k), & p_k \le p_k^{max} \\ F'(p_k, k), & \text{otherwise} \end{cases} \quad 1 \le k \le v$$

or alternatively $$\hat{F}(p_k, k) = \begin{cases} F(p_k, k), & p_{k+1} - 1 \le p_k^{max} \\ F'(p_k, k), & \text{otherwise} \end{cases} \quad 1 \le k \le v$$

where v is the number of elements in the set, $F(p_k,k)$ is the standard combinatorial function, and $F'(p_k,k)$ is the approximate combinatorial function.

12. The apparatus of claim 11 wherein the approximate combinatorial function output comprises $\hat{F}=F'(n,d)=R'(S'(n)-S'(n-d)-Q'(d))$, wherein n is a position parameter, d is a pulse index parameter, R' is an estimate of a power function, S'(n) is a log domain estimate of n!, and Q'(d) is a log domain estimate of d!.

13. The apparatus of claim 11 wherein the standard combinatorial function output is expressed by $$\hat{F} = F(n, d) = \frac{n!}{d!(n-d)!}$$

wherein n is a position parameter and d is a pulse index parameter.

* * * * *